(12) United States Patent
Sridharan et al.

(10) Patent No.: US 9,776,911 B2
(45) Date of Patent: Oct. 3, 2017

(54) DIELECTRIC PASTES FOR ALUMINUM SUBSTRATES

(71) Applicant: Ferro Corporation, Mayfield Heights, OH (US)

(72) Inventors: Srinivasan Sridharan, Strongsville, OH (US); Orville W. Brown, Carlsbad, CA (US); George E. Graddy, Jr., Del Mar, CA (US)

(73) Assignee: Ferro Corporation, Mayfield Heights, OH (US)

( * ) Notice: Subject to any disclaimer, the term of this patent is extended or adjusted under 35 U.S.C. 154(b) by 0 days.

(21) Appl. No.: 14/911,035

(22) PCT Filed: Oct. 6, 2014

(86) PCT No.: PCT/US2014/059219
§ 371 (c)(1),
(2) Date: Feb. 9, 2016

(87) PCT Pub. No.: WO2015/065654
PCT Pub. Date: May 7, 2015

(65) Prior Publication Data
US 2016/0185651 A1    Jun. 30, 2016

Related U.S. Application Data

(60) Provisional application No. 61/896,187, filed on Oct. 28, 2013.

(51) Int. Cl.
*H01B 3/08* (2006.01)
*C03C 3/00* (2006.01)
(Continued)

(52) U.S. Cl.
CPC .............. *C03C 8/16* (2013.01); *C03C 3/097* (2013.01); *C03C 8/08* (2013.01); *C03C 8/14* (2013.01);
(Continued)

(58) Field of Classification Search
CPC .. C03C 3/097; C03C 8/08; C03C 8/14; C03C 8/16; C03C 2204/00; C03C 2207/08;
(Continued)

(56) References Cited

U.S. PATENT DOCUMENTS

2010/0009203 A1* 1/2010 Nageno ................. C03C 8/04
428/428
2010/0086771 A1* 4/2010 Nageno ................. C03C 3/089
428/332

(Continued)

FOREIGN PATENT DOCUMENTS

CN  101740160 A   6/2010
JP  2010-195960   9/2010
(Continued)

OTHER PUBLICATIONS

Espacent bibliographic data for RU2384027 published Mar. 10, 2010, one page.
(Continued)

*Primary Examiner* — Hoa C Nguyen
(74) *Attorney, Agent, or Firm* — Rankin, Hill & Clark LLP

(57) ABSTRACT

High thermal conductivity dielectric materials systems or pastes are useful on aluminum alloy substrates for LED and high power circuitry applications.

16 Claims, 1 Drawing Sheet

(51) Int. Cl.
*C03C 8/16* (2006.01)
*C09K 5/14* (2006.01)
*H05K 1/03* (2006.01)
*H05K 1/05* (2006.01)
*H05K 3/20* (2006.01)
*C03C 3/097* (2006.01)
*C03C 8/08* (2006.01)
*C03C 8/14* (2006.01)

(52) U.S. Cl.
CPC ............... *C09K 5/14* (2013.01); *H01B 3/087* (2013.01); *H05K 1/0306* (2013.01); *H05K 1/05* (2013.01); *H05K 3/20* (2013.01); *C03C 2204/00* (2013.01); *C03C 2207/08* (2013.01)

(58) Field of Classification Search
CPC ........ H01B 3/087; C09K 5/14; H05K 1/0306; H05K 1/05; H05K 3/20
See application file for complete search history.

(56) References Cited

U.S. PATENT DOCUMENTS

| | | | | |
|---|---|---|---|---|
| 2011/0095240 | A1* | 4/2011 | Nakamura | C03C 3/062 252/514 |
| 2011/0315210 | A1* | 12/2011 | Hang | C03C 3/07 136/256 |
| 2012/0225197 | A1* | 9/2012 | Ebigase | H01L 41/29 427/77 |
| 2013/0228207 | A1* | 9/2013 | Wang | H01L 31/022425 136/244 |
| 2015/0007881 | A1* | 1/2015 | Khadilkar | H01L 31/022425 136/256 |

FOREIGN PATENT DOCUMENTS

| | | |
|---|---|---|
| RU | 2052850 C1 | 1/1996 |
| RU | 2384027 C2 | 3/2010 |
| RU | 123620 U1 | 12/2012 |
| WO | 2010/020753 A2 | 2/2010 |

OTHER PUBLICATIONS

International Search Report for corresponding PCT/US2014/059219 mailed Jan. 29, 2015, one page.

Machine translation of CN101740160 published Jun. 16, 2010, three pages.

Machine translation of JP2010-195960 published Sep. 9, 2010, nineteen pages.

Chung, "Materials for thermal conduction," Applied Thermal Engineering 21 (2001) pp. 1593-1605.

* cited by examiner

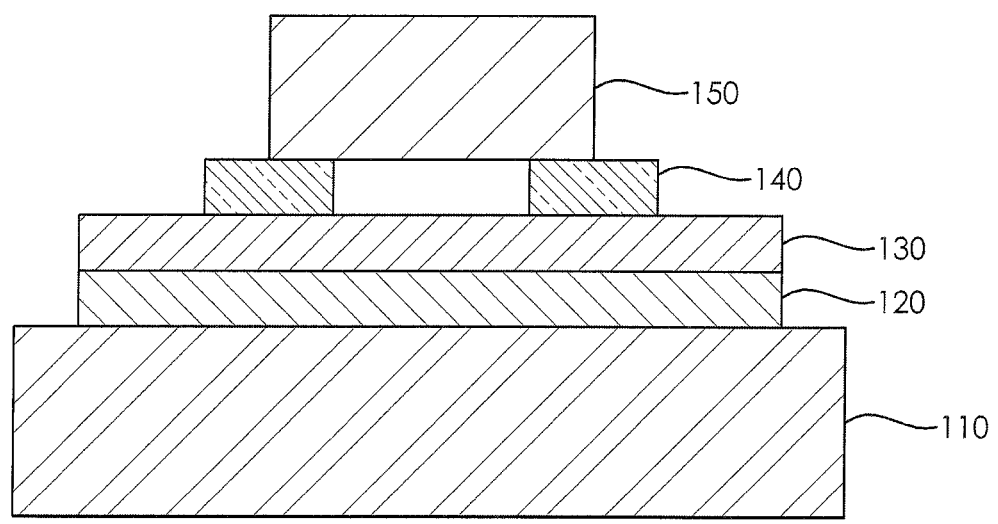

DIELECTRIC PASTES FOR ALUMINUM SUBSTRATES

FIELD OF THE INVENTION

The present invention provides high thermal conductivity dielectric materials systems or pastes for use on aluminum alloy substrates for LED and high power circuitry applications.

BACKGROUND OF THE INVENTION

There has been continued interest in providing inorganic based dielectrics with good electrical isolation yet possessing excellent thermal conductivity to be applied on substrates made of aluminum and its alloys. Such substrates can act as good heat sinks to take out the heat from the device/dielectrics interface to keep them cool while operating at higher wattage and/or conducting high currents through circuitry laid down on top of these dielectrics coated metal substrates for electronic applications such as substrates for high brightness high power LEDs used in automotive electronics, next generation lighting, television, high power electronics, OLEDs, and solar applications.

SUMMARY OF THE INVENTION

The difficulties and drawbacks associated with known systems are overcome in the present invention.

For relatively low temperature flow and sintering applications (typically 660° C. or less for aluminum and its alloys), but for high use temperatures (up to 200 to 300° C.) inorganic (glass or glass-ceramics or ceramics) based dielectric systems are needed. Among other desirable properties, these glass or glass-ceramic based dielectrics offer low flow temperatures needed to avoid melting aluminum and its alloys. Generally glasses have relatively low thermal conductivity and high insulation resistance. Hence increasing the thermal conductivity (for good heat dissipation) while retaining high breakdown voltage and insulation resistance (for electrical isolation) is a challenge.

Any attempt to incorporate metallic particles into these glass based dielectrics to improve thermal conductivity could result in loss of electrical isolation. Therefore this research has been carried out to explore attaining high thermal conductivity and higher insulation resistance (or in other words higher breakdown voltage) in glass based inorganic dielectrics.

An embodiment of the invention is a paste containing a glass component for use in forming a dielectric layer upon an aluminum substrate upon firing.

The glass component includes at least one glass selected from the group consisting of: (i) an alkali oxide rich glass and (ii) a bismuth oxide rich glass.

An embodiment of the invention is a dielectric composition comprising: (a) a glass component comprising (i) from about 30 to about 75 mol % $SiO_2$, (ii) from about 5 to about 25 mol % $TiO_2$, (iii) from about 5 to about 40 mol % ($Li_2O+Na_2O+K_2O+Rb_2O+Cs_2O$), and (iv) from about 0.1 to about 15 mol % ($P_2O_5+Nb_2O_5+V_2O_5$), (b) an organic vehicle, and (c) a solvent. The dielectric composition of this or any other embodiment herein may further comprise a thermal conductivity enhancer.

Another embodiment of the invention is an electronic device comprising: (a) an aluminum substrate, (b) at least one layer of any dielectric composition disclosed herein, disposed on at least a portion of the aluminum substrate, (c) a conductive trace comprising at least one selected from the group consisting of copper, aluminum, silver, platinum and palladium, and (d) a power circuit, wherein the substrate, dielectric composition and conductive trace are arranged so that the dielectric composition at least one of electrically separates and physically separates the aluminum substrate and conductive trace and wherein the power circuit contacts only the conductive trace.

Another embodiment of the invention is a method of forming a dielectric layer upon an aluminum substrate comprising the steps of: (a) applying a dielectric composition paste upon an aluminum substrate, and (b) firing the substrate to form a dielectric layer upon the substrate. The dielectric composition is any disclosed herein. Multiple layers of dielectric paste may be applied prior to firing. The firing can be conducted at a temperature of from about 400 to about 660° C.

An embodiment of the invention is a method of producing an electronic device comprising (a) providing an aluminum substrate, (b) applying to the aluminum substrate at least one layer of any dielectric composition disclosed herein, (c) applying at least one layer of a conductive paste to the at least one layer of dielectric composition, to form an assembly, (d) firing the assembly at 400-660° C. to sinter the dielectrics and conductive paste, and (e) positioning a power circuit in electrical contact with the at least one layer of conductive paste.

An embodiment of the invention is an electronic device selected from the group consisting of vacuum insulated glass, solar cell contact, solar cell, solar cell module, organic PV device, plasma display device, nanocrystal display, electrochromic device, electrochromic material system, sensors, suspended particle device, micro-blind, liquid crystal device, smart window, switchable window, smart glass, eglass, quantum dot devices, thermoelectric devices, batteries, light emitting diodes (LED), surface-conduction electron-emitter display (SED), field emission displays (FED), organic light emitting diodes (OLED), liquid crystal displays (LCD), digital light processing (DLP), ferro-liquid displays (FLD), interferometric modulator displays (IMOD), thick-film dielectric electroluminescent displays (TDEL), quantum dot electroluminescent displays (QDLED), time multiplexed optical shutters (TMOS), telescopic pixel displays (TPD), liquid crystal lasers (LCL), laser phosphor displays (LPD), organic light-emitting transistors (OLET), and combinations thereof, which comprises at least one layer of any dielectric composition disclosed herein.

BRIEF DESCRIPTION OF THE DRAWING

FIG. 1 is a cross-sectional view of a preferred embodiment of the invention.

DESCRIPTION OF THE PREFERRED EMBODIMENTS

The present invention provides an electrically insulative, low temperature fireable glass-based dielectric composition that can be used in numerous applications. In certain versions of the invention, the compositions are solvent-free. The invention also provides methods of forming electrically conductive films, circuits, traces, contacts and the like using the inventive compositions. The invention includes devices, products and/or coated substrates formed using the inventive compositions and methods.

For relatively low temperature flow and sintering applications (typically <660° C. for aluminum and its alloys), but for high use temperatures (up to 200 to 300° C.) inorganic (glass or glass-ceramics or ceramics) based dielectric systems are needed. Among these glass or glass-ceramics based dielectrics offer low flow temperatures needed for not to melt aluminum alloys. Generally glasses have relatively low thermal conductivity and high insulation resistance. Hence increasing the thermal conductivity (for good heat dissipation) while retaining high breakdown voltage (BDV) and insulation resistance (for electrical isolation) is a challenge.

A device employing the dielectric pastes of the invention is fabricated as follows.

As shown in FIG. 1, an aluminum substrate, 110, which may be made of an aluminum alloy such as those from Table 1, below, is provided. At least one layer (120, 130) of a dielectric paste including any glass composition herein is applied over at least one side of the substrate 110. A conductive paste 140 is selectively applied over the dielectric paste layer(s). The assembly is fired at a temperature sufficient to sinter the dielectrics and conductive paste. Finally, a power circuit, such as an electronic device or LED (for example), signified by 150, is placed in contact with the conductive paste 140. Each layer is printed and fired separately. However, cofiring multiple layers simultaneously is also envisioned.

The inventors have developed new inorganic dielectrics that: (a) can be applied and sintered on aluminum and its alloys at 400-660° C. (peak temperature using thick film firing profiles); (b) can have conductive traces of copper, aluminum or silver thick films on top to provide current conduction paths; (c) can provide breakdown voltages of 750 V/mil or higher depending on dielectrics layer thickness, length of the conductors and number of layers; (d) can have thermal conductivity as high as 1.0 to 5.0 W/m-K; (e) can have use temperature as high as 350° C.; and (f) can in certain instances pass testing at 85° C./85% RH for 1,000 hours and higher without losing electrical isolation.

The major components of the invention: substrate, glass compositions, organic vehicle are set forth hereinbelow.

Aluminum Substrate. Use of aluminum and its alloys for substrates dictates that the dielectric paste has to fire at temperatures less than the solidus of the alloy. Any aluminum alloy is suitable. Examples of suitable aluminum alloys include AL 1050, AL 1060, AL 1100, AL 2024, AL 3003, AL 380, AL 384, AL 5052, AL 514, AL 6061, and AL 6063, each individually or in any combination, as shown in Table 1. Depending on the solidus of the aluminum alloy the firing temperatures can range from 400 to 660° C., where the melting point of pure aluminum is 664° C. More preferably the firing temperatures are 450-610° C., most preferably 480-600° C.

TABLE 1

Solidus & Thermal Conductivity of Aluminum Alloys

| Alloy | Al Content Wt % | Others | Solidus ° C. | Thermal Conductivity (@25° C.) W/m-° K |
|---|---|---|---|---|
| AL 1050 | 99.1+ | Fe, Si | 650 | 222 |
| AL 1060 | 99.6+ | Cu, Si | 646 | 234 |
| AL 1100 | 99.0+ | Cu (0.2-0.5), Fe, Si, Zn, Mn | 643 | 221 |
| AL 3003 | 98.3+ | Mn(1.5)—Cu (0.05-0.2), Fe, Si, Zn | 643 | 193 |
| AL 6063 | 98.5+ | Mg (0.45-0.9); Si (0.2-0.6), Fe, Mn, Zn, Cr, Ti | 616 | 218 |
| AL 5052 | 96.8+ | Mg (2.2-2.8); Cr (0.15-0.35) Fe, Cu, Si, Zn, Mn | 607 | 138 |
| AL 514 | 96.0 | Mg (4.0) | 599 | 138 |
| AL 6061 | 97.2+ | Mg (0.8-1.2)—Si (0.4-0.8) Cr (0.15-0.35)—Cu (0.15-0.4) | 582 | 180 |
| AL 384 | 77.3+ | Si (10.5-12.0); Cu (3-4.5); Zn (0-3); Fe (1.3); Mg, Mn, Ni & Sn | 516 | 92 |
| AL 2024 | 90.7+ | Cu (3.8-4.9); Mg (1.2-1.8); Mn (0.3-0.9) Fe, Si, Zn, Ti | 502 | 121 |

Glass Compositions. A dielectric composition (in the form of a paste) for forming the dielectric layers can be obtained by mixing an organic vehicle with one or more glass compositions. Appropriate proportions of glass compositions (glass frits) in the dielectric material are determined such that after firing, the desired dielectric layer composition may be obtained. The glass frits useful herein have a $D_{50}$ particle size of about 0.1 to about 10 microns, preferably about 3 to 8 microns, more preferably about 3 to 5 microns, alternately more preferably about 5 to 8 microns. In another embodiment, the $D_{50}$ particle size is 0.1-2 microns, preferably 0.1-1 microns. Another particle parameter is $D_{95}$, which is 15 microns or less, preferably 12 microns or less, more preferably 10 microns or less, and most preferably 5 microns or less. The maximum particle size, Dmax, is 50 microns or less, preferably 30 microns or less, more preferably 25 microns or less, still more preferably 20 microns or less, yet more preferably 15 microns or less and most preferably 10 microns or less. The aforementioned ranges with "or less" can in each case alternately be bounded by a lower limit of 0.01 microns, 0.1 microns or 1 micron. Smaller particle sizes allow the fabrication of thinner dielectric layers, for example less than 100 microns, less than 80 microns, less than 60 microns, less than 50 microns, less than 40 microns, less than 30 microns, less than 20 microns, less than 10 microns and less than 5 microns. Thinner dielectric layers improves thermal conductance.

Table 2 broadly lists some key glass compositions useful in this invention. An entry such as "$Li_2O+Na_2O+K_2O+Rb_2O+Cs_2O$ 5-40" means that any or all of $Li_2O$, $Na_2O$, $K_2O$, $Rb_2O$, and/or $Cs_2O$ is present in any combination in an amount of 5 to 40 mole percent of an overall glass composition.

TABLE 2

| Mole % | A | B | C | D | E | F | G | H | J | K |
|---|---|---|---|---|---|---|---|---|---|---|
| Bi2O3 | <25 | <15 | <10 | 2-8 | 2-8 | 2-8 | 0 | 0 | 0 | 2-8 |
| B2O3 | <30 | <20 | <15 | <5 | <5 | 1-3 | 0 | 0 | 0 | 1-3 |
| ZnO | <20 | <15 | <12 | <5 | <5 | 1-4 | 0 | 0 | 0 | 1-4 |
| SiO$_2$ | 30-75 | 30-70 | 35-70 | 42-70 | 42-60 | 50-68 | 53-61 | 50-68 | 50-68 | 42-68 |
| TiO2 | <25 | <20 | <15 | 5-14 | 5-14 | 7-15 | 8-14 | 9-13 | 10-12 | 9-15 |
| Li$_2$O + Na$_2$O + K$_2$O + Rb$_2$O + Cs$_2$O | 5-40 | 10-40 | 11-37 | 15-30 | 15-30 | | | 18-27 | 19-26 | 20-25 | 15-30 |
| Nb$_2$O$_5$ + P$_2$O$_5$ + V$_2$O$_5$ | <15 | <10 | <10 | | 2-8 | <8 | 1-7 | | 2-7 | 2-7 |
| Li$_2$O | | | | | | 2-7 | 2-7 | 2-7 | 2-7 | 2-7 |
| Na$_2$O | | | | | | 9-15 | 9-15 | 11-15 | 11-14 | 9-15 |
| K$_2$O | | | | | | 4-8 | 4-8 | 4.5-7 | 5-7 | 4-8 |

Table 2 is to be read as additionally disclosing any range noted therein, wherein the lower bound is instead 0.1 or 1 mole %. A range of 5-25 mol % TiO$_2$ may also be understood from column A. Values from different columns in a table may be combined, and certain embodiments may include some, but not all, values from given column Other embodiments may specify some, but not all components (oxides) from a table. For example an embodiment may include two values from Table 2 (which may or may not be in the same column). Any glass frit in any table may further include at least one selected from the group consisting of: (a) from about 0.1 to about 10 mol % Bi$_2$O$_3$, (b) from about 0.1 to about 15 mol % B$_2$O$_3$, and (c) from about 0.1 to about 12 mol % ZnO. All such combinations are contemplated herein.

The following glass compositions are also suitable:

TABLE 3

Key Glass Components in selected glasses.

| Oxide/ Mole % | A | B | C | D | E |
|---|---|---|---|---|---|
| Bi2O3 | 0 | 4.92 | 0 | 6.17 | 0 |
| B2O3 | 0 | 2.28 | 0 | 2.86 | 0 |
| ZnO | 0 | 2.2 | 0 | 2.76 | 0 |
| SiO2 | 67.73 | 57.58 | 57.03 | 43.59 | 59.77 |
| TiO2 | 10.17 | 9.31 | 12.43 | 11.67 | 11.64 |
| Li2O | 3.01 | 5.15 | 3.69 | 6.46 | 3.45 |
| Na2O | 11.64 | 11.22 | 14.23 | 14.08 | 13.32 |
| K2O | 4.92 | 4.51 | 6.02 | 5.66 | 5.64 |
| Nb2O5 | 0 | 0.42 | 0 | 0.53 | 0 |
| P2O5 | 0.49 | 0.45 | 0.6 | 0.56 | 0.56 |
| V2O5 | 2.04 | 1.86 | 6 | 5.66 | 5.62 |
| Total | 100 | 100 | 100 | 100 | 100 |

Suitable commercial glasses, available from Ferro Corporation, Cleveland Ohio, include EG 2871, EG 2934, EG 2964, EG 3046, EG 3600, EG 3608, GL 4317 and others.

Organic Vehicle. The organic vehicle is a binder in an organic solvent or a binder in water. The binder used herein is not critical; conventional binders such as ethyl cellulose, polyvinyl butanol, ethyl cellulose, and hydroxypropyl cellulose, and combinations thereof are appropriate in combination with a solvent. The organic solvent is also not critical and may be selected in accordance with a particular application method (i.e., printing or sheeting), from conventional organic solvents such as butyl carbitol, acetone, toluene, ethanol, diethylene glycol butyl ether; 2,2,4-trimethyl pentanediol monoisobutyrate (Texanol™); alpha-terpineol; beta-terpineol; gamma terpineol; tridecyl alcohol; diethylene glycol ethyl ether (Carbitol™), diethylene glycol butyl ether (Butyl Carbitol™) and propylene glycol; and blends thereof, Products sold under the Texanol® trademark are available from Eastman Chemical Company, Kingsport, Tenn.; those sold under the Dowanol® and Carbitol® trademarks are available from Dow Chemical Co., Midland, Mich. Alternatively, the binder could be selected from polyvinyl alcohol (PVA), polyvinyl acetate (PVAC) in combination with water. Also, commercially available vehicles from Ferro Corporation having product numbers ER2750, ER2761, ER2766 and ER2769, and others, and combinations thereof, are suitable.

No particular limit is imposed on the organic vehicle content of the pastes. Often the paste contains about 1 to 5 wt % of the binder and about 10 to 50 wt % of the organic solvent, with the balance being the dielectric component (for a dielectric layer). If desired, the respective dielectric compositions may contain up to about 10 wt % of other additives such as dispersants, plasticizers, and thixotropic additives.

Conductors can be any known in the art, including those disclosed in commonly owned U.S. Pat. No. 7,176,152, hereby incorporated by reference with the proviso that such conductors are capable of being fired at 660° C. or less.

Firing. The dielectric paste is fired in air, at a temperature of less than 660° C., or from about 500° C. to about 660° C., preferably at 560-620° C., more preferably at 570-600° C. The dielectric compositions herein require no more than 660° C. to effect full fusion and sintering of the dielectric. The firing temperature is held for about 10-30 minutes to enhance densification. The firing temperature ramp is typically 5° C. per minute, although other ramp rates (in degrees Celsius per minute) of 1°, 2°, 10°, 15° or 20° can be used. The pastes can be fired in a typical belt furnace also. Belt furnaces may have 2-15 zones each with different temperatures.

Use of aluminum and its alloys for substrates dictates that the dielectric paste has to fire at temperatures less than the solidus of the alloy. These aluminum alloys can be any shown in Table 1. Depending on the solidus of the aluminum alloy the firing temperatures can range from 400 to 660° C., where the melting point of pure aluminum is 664° C. More preferably the firing temperatures are 450-610° C., most preferably 480-600° C.

For such low firing temperatures either high lead glass or high bismuth glass or high alkali glasses can be used. In certain applications lead should be avoided. Glasses having high lead and high bismuth contents can have high breakdown voltage (BDV) so long as the contents of alkali oxides is controlled, to include a value of zero, but the expansion mismatch with aluminum will be high. If the alkali content is increased to increase the expansion then electrical properties suffer.

The inventors researched various glass compositions and their mixtures, both with glasses alone, and glasses together with oxide additives. Desirable compositional ranges or formulas, are shown in Tables 2 and 3 for the glass component, while the dielectric pastes set forth in Table 4 provide acceptable dielectrics that could be fired at temperatures <660° C., pass electrical requirements as well as 85 C/85% RH for 1,000 hours without losing electrical isolation.

Note that in connection with the practice of this invention a glass component may comprise a single glass, mixture of glasses, or a mixture of glasses and inorganic oxides additives. For example the glass components in Tables 2 and 3 may contain multiple glasses as well as glass plus crystalline additives. For example the glass component can have a glass rich in bismuth oxide, another glass rich in alkalis with or without crystalline additives such as silica in mineral forms such as quartz, tridymite, cristobalite or in commercially known grades such as minusil; silicates such as zinc silicate (willemite) or titanates such as zinc titanate or bismuth titanate.

Although it is desired in some applications to avoid lead (Pb) containing glasses, it is envisioned that low melting lead glasses with compositions comprising 25-75 mole % PbO and a $B_2O_3$ content less than 30 mole % can be added to attain firing temperatures <540° C. and thus be utilized in the present invention.

In addition to these glass components the final dielectric pastes can optionally include thermal conductivity enhancing additives (thermal conductivity enhancer) with thermal conductivity (K) typically in the range of 1-2 W/m-K. This is in contrast to typical glass thermal conductivity of about 0.5 W/m-k. The thermal conductivity for the additives is, in a preferred embodiment, K≥30 (such as Boron Nitride), still more preferred K≥50 (that of Boron Carbide) yet more preferred K≥80 (that of Silicon Carbide), even more preferred K≥149 (that of Silicon). Still more preferred is when K≥150-200 (that of Aluminum Nitride), and most preferred are additions of diamond powders with thermal conductivity up to 500 W/m-K, such as metal bonded diamond powder (MDP), resin bonded diamond powder (RDP), polycrystalline diamond powder (PDP), or natural diamond powder (NDP) from Advanced Abrasives Corporation, Pennsauken, N.J. 08109. The additives detailed in this paragraph are suitable for use in the invention. Metal powders should be avoided as they would degrade the electrical properties of a dielectric composition including them, if there are have current conducting circuit elements on these dielectrics on top of aluminum base.

EXAMPLES

Table 4 lists key dielectric compositions of the invention tested as dielectrics for aluminum LED substrates. These dielectric pastes were printed and fired on AL3003 substrates at peak temperatures of 580-600° C. in a standard thick film firing profile. The firing was conducted in a Watkin-Johnson 12-zone belt furnace at a belt speed of 3.6" (9.1 cm) per minute. The vehicle is a combination of ethyl-cellulose-based vehicles commercially available from Ferro Corporation. The sequence of dielectric layers on aluminum substrate is shown in FIG. 1 and listed in Table 5. After firing the thermal conductivity of these dielectrics is measured using ASTM E1461 Laser Flash Method. The results are summarized in Table 5.

TABLE 4

Dielectric Pastes

| Glass/wt % | Paste E1 | Paste B1 | Paste C1 | Paste C2 | Paste D1 |
|---|---|---|---|---|---|
| Glass B | | 67.59 | | | |
| Glass C | | | 56.23 | 53 | |
| Glass D | | | | | 55.13 |
| Glass E | 66.72 | | | | |
| V9250 blue pigment | 1.35 | 1.46 | 1.35 | 1.35 | 1.46 |
| Silicon powder | | | 11.77 | | |
| MDP powder | | | | 15.01 | 12.46 |
| Vehicle | 25.68 | 26 | 25.7 | 25.69 | 26 |
| Texanol solvent | 6.25 | 4.95 | 4.95 | 4.95 | 4.95 |
| Total | 100 | 100 | 100 | 100 | 100 |

TABLE 5

Dielectrics on Aluminum Substrates and Their Thermal Conductivities

| | Paste A | I | II | III |
|---|---|---|---|---|
| Substrate | AL3003 | AL3003 | AL3003 | AL3003 |
| Bottom dielectric | Paste E1 | Paste E1 | Paste C1 | Paste C2 |
| Top dielectric - layer I | Paste B1 | Paste D1 | Paste D1 | Paste D1 |
| Top dielectric - layer II | Paste C1 | Paste D1 | Paste D1 | Paste D1 |
| At room temperature | | | | |
| Thickness, dielectrics alone, mm | 0.074 | 0.068 | 0.094 | 0.074 |
| Thickness, metal substrate + dielectrics, mm | 1.63 | 1.631 | 1.649 | 1.625 |
| Average bulk density of dielectrics, gm/cc | 3.08 | 3.23 | 3.18 | 3.25 |
| Specific heat of dielectrics, Cp, J/g-K | 0.673 | 0.706 | 0.718 | 0.705 |
| Diffusivity of dielectrics, α, $mm^2$/sec | 0.576 | 0.664 | 1.05 | 1.25 |
| Thermal conductivity, K, W/m-K | | | | |
| Thermal conductivity (Dielectrics alone) W/m-K | 1.19 | 1.51 | 2.39 | 2.86 |
| Thermal conductivity (metal substrate + dielectrics) W/m-K | 22.8 | 30 | 33.9 | 46.2 |

An embodiment of the invention is a device selected from the group consisting of vacuum insulated glass, solar cell contact, solar cell, solar cell module, organic PV device, plasma display device, nanocrystal display, electrochromic device, electrochromic material system, sensors, suspended particle device, micro-blind, liquid crystal device, smart window, switchable window, smart glass, eglass, quantum dot devices, thermolectric devices, batteries, light emitting diodes (LED), surface-conduction electron-emitter display (SED), field emission displays (FED), organic light emitting diodes (OLED), liquid crystal displays (LCD), digital light processing (DLP), ferro-liquid displays (FLD), interferometric modulator displays (IMOD), thick-film dielectric electroluminescent displays (TDEL), quantum dot electroluminescent displays (QDLED), time multiplexed optical shutters (TMOS), telescopic pixel displays (TPD), liquid crystal lasers (LCL), laser phosphor displays (LPD), organic light-emitting transistors (OLET), and combinations thereof, which comprises at least one dielectric layer including a glass composition disclosed herein.

Many other benefits will no doubt become apparent from future application and development of this technology. All patents, published applications, and articles noted herein are hereby incorporated by reference in their entirety.

As described hereinabove, the present invention solves many problems associated with conventional devices. However, it will be appreciated that various changes in the details, materials and formulations, which have been herein described and illustrated in order to explain the nature of the invention, may be made by those skilled in the art without departing from the principle and scope of the invention, as expressed in the appended claims.

The invention claimed is:

1. An electronic device comprising:
   a. an aluminum substrate,
   b. at least one layer of a dielectric composition disposed on at least a portion of the aluminum substrate,
   c. a conductive trace, and
   d. a power circuit,
   wherein the dielectric composition comprises before firing:
   a. a glass component comprising
      i. from about 30 to about 75 mol % $SiO_2$,
      ii. from about 5 to about 25 mol % $TiO_2$,
      iii. from about 5 to about 40 mol % ($Li_2O+Na_2O+K_2O+Rb_2O+Cs_2O$), and
      iv. from about 0.1 to about 15 mol % ($P_2O_5+Nb_2O_5+V_2O_5$),
   b. an organic vehicle, and
   c. a solvent;
   wherein the substrate, dielectric composition and conductive trace are arranged so that the dielectric composition at least one of (i) electrically separates and (ii) physically separates the aluminum substrate and conductive trace and wherein the power circuit contacts only the conductive trace.

2. The electronic device of claim 1, wherein the aluminum substrate comprises a material selected from the group consisting of AL 1050, AL 1060, AL 1100, AL 2024, AL 3003, AL 380, AL 384, AL 5052, AL 514, AL 6061, and AL 6063.

3. The electronic device of claim 1, wherein the conductive trace includes at least one metal selected from the group consisting of copper, aluminum, silver, platinum and palladium.

4. The electronic device of claim 1, further comprising a thermal conductivity enhancer.

5. The electronic device of claim 4, wherein the thermal conductivity enhancer is selected from the group consisting of boron nitride, boron carbide, silicon carbide, silicon, aluminum nitride, metal bonded diamond powder, resin bonded diamond powder, polycrystalline diamond powder, and natural diamond powder.

6. The electronic device of claim 1, wherein the glass component comprises:
   a. from about 35 to about 70 mol % $SiO_2$,
   b. from about 5 to less than 15 mol % $TiO_2$,
   c. from about 11 to about 37 mol % ($Li_2O+Na_2O+K_2O+Rb_2O+Cs_2O$), and
   d. from about 1 to about 10 mol % ($P_2O_5+Nb_2O_5+V_2O_5$).

7. The electronic device of claim 6, wherein the glass component further comprises at least one selected from the group consisting of:
   a. from about 0.1 to about 10 mol % $Bi_2O_3$,
   b. from about 0.1 to about 15 mol % $B_2O_3$, and
   c. from about 0.1 to about 12 mol % ZnO.

8. The electronic device of claim 1, wherein the glass component comprises:
   a. from about 42 to about 70 mol % $SiO_2$,
   b. from about 5 to about 14 mol % $TiO_2$,
   c. from about 15 to about 30 mol % ($Li_2O+Na_2O+K_2O+Rb_2O+Cs_2O$), and
   d. from about 2 to about 8 mol % ($P_2O_5+Nb_2O_5+V_2O_5$).

9. The electronic device of claim 8, wherein the glass component further comprises at least one selected from the group consisting of:
   a. from about 2 to about 8 mol % $Bi_2O_3$,
   b. from about 0.1 to about 5 mol % $B_2O_3$, and
   c. from about 0.1 to about 5 mol % ZnO.

10. The electronic device of claim 1, wherein the glass component comprises:
    a. from about 42 to about 60 mol % $SiO_2$,
    b. from about 8 to about 14 mol % $TiO_2$,
    c. from about 2 to about 7 mol % $Li_2O$,
    d. from about 10 to about 15 mol % $Na_2O$,
    e. from about 4 to about 7 mol % $K_2O$,
    f. from about 0.1 to about 1 mol % $P_2O_5$, and
    g. from about 1 to about 7 mol % $V_2O_5$.

11. The electronic device of claim 10, wherein the glass component further comprises at least one selected from the group consisting of:
    a. from about 3 to about 7 mol % $Bi_2O_3$,
    b. from about 1 to about 4 mol % $B_2O_3$,
    c. from about 2 to about 4 mol % ZnO, and
    d. from about 0.1 to about 1 mol % $Nb_2O_5$.

12. The electronic device of claim 1, wherein the glass component comprises
    a. from about 50 to about 68 mol% $SiO_2$,
    b. from about 9 to about 13 mol % $TiO_2$,
    c. from about 2 to about 7 mol % $Li_2O$,
    d. from about 9 to about 15 mol % $Na_2O$,
    e. from about 4 to about 8 mol % K2O,
    f. from about 0.2 to about 1.1 mol % $P_2O_5$, and
    g. from about 1.5 to about 7 mol % $V_2O_5$.

13. The electronic device of claim 12, wherein the glass component further comprises at least one selected from the group consisting of:
    a. from about 2 to about 8 mol % $Bi_2O_3$,
    b. from about to about 3 mol % $B_2O_3$,
    c. from about 1 to about 4 mol % ZnO, and
    d. from about 0.1 to about 1.5 mol% $Nb_2O_5$.

14. The electronic device of claim 1, wherein the glass component includes glass frit particles having a $D_{50}$ particle size of 0.1-10 microns and a $D_{95}$ particle size of 0.1-15 microns.

15. An electronic device comprising:
    a. an aluminum substrate,
    b. at least one layer of a dielectric composition disposed on at least a portion of the aluminum substrate,
    c. a conductive trace, and
    d. a power circuit,
    wherein the dielectric composition comprises before firing:
    a. a glass component comprising
       i. from about 50 to about 68 mol% $SiO_2$,
       ii. from about 9 to about 13 mol% $TiO_2$,
       iii. from about 2 to about 7 mol% $Li_2O_2$
       iv. from about 9 to about 15 mol% $Na_2O$,
       V. from about 4 to about 8 mol% $K_2O$,
       vi. from about 0.2 to about 1.1 mol% $P_2O_5$
       vii. from about 1.5 to about 7 mol% $V_2O_5$, b. an organic vehicle, and
c. a solvent;
wherein the substrate, dielectric composition and conductive trace are arranged so that the dielectric composition at least one of (i) electrically separates and (ii) physically separates the aluminum substrate and conductive trace and wherein the power circuit contacts only the conductive trace.

16. An electronic device comprising at least one layer of a dielectric composition comprising prior to firing:
a. a glass component comprising
   i. from about 30 to about 75 mol % $SiO_2$,
   ii. from about 5 to about 25 mol % $TiO_2$,
   iii. from about 5 to about 40 mol % ($Li_2O+Na_2O+K_2O+Rb_2O+Cs_2O$), and
   iv. from about 0.1 to about 15 mol % ($P_2O_5+Nb_2O_5+V_2O_5$),
b. an organic vehicle, and
c. a solvent;
wherein, the electronic device selected from the group consisting of vacuum insulated glass, solar cell contact, solar cell, solar cell module, organic PV device, plasma display device, nanocrystal display, electrochromic device, electrochromic material system, sensors, suspended particle device, micro-blind, liquid crystal device, smart window, switchable window, smart glass, e-glass, quantum dot devices, thermoelectric devices, batteries, light emitting diodes, surface-conduction electron-emitter displays, field emission displays, organic light emitting diodes, liquid crystal displays, digital light processing, ferro-liquid displays, interferometric modulator displays, thick-film dielectric electroluminescent displays, quantum dot electroluminescent displays, time multiplexed optical shutters, telescopic pixel displays, liquid crystal lasers, laser phosphor displays, organic light-emitting transistors, and combinations thereof.

* * * * *